(12) United States Patent
Miki et al.

(10) Patent No.: US 8,148,712 B2
(45) Date of Patent: Apr. 3, 2012

(54) GROUP III NITRIDE COMPOUND SEMICONDUCTOR STACKED STRUCTURE

(75) Inventors: Hisayuki Miki, Ichihara (JP); Hiromitsu Sakai, Ichihara (JP); Kenzo Hanawa, Ichihara (JP); Yasunori Yokoyama, Ichihara (JP); Yasumasa Sasaki, Ichihara (JP); Hiroaki Kaji, Ichihara (JP)

(73) Assignee: Showa Denko K.K., Tokyo (JP)

( * ) Notice: Subject to any disclaimer, the term of this patent is extended or adjusted under 35 U.S.C. 154(b) by 221 days.

(21) Appl. No.: 12/300,306

(22) PCT Filed: May 8, 2007

(86) PCT No.: PCT/JP2007/059820
§ 371 (c)(1),
(2), (4) Date: Nov. 10, 2008

(87) PCT Pub. No.: WO2007/129773
PCT Pub. Date: Nov. 15, 2007

(65) Prior Publication Data
US 2009/0146161 A1 Jun. 11, 2009

(30) Foreign Application Priority Data
May 10, 2006 (JP) .................................. 2006-131530
Aug. 29, 2006 (JP) .................................. 2006-231862

(51) Int. Cl.
*H01L 29/06* (2006.01)

(52) U.S. Cl. ................................ 257/13; 257/12; 257/79
(58) Field of Classification Search .................... 257/79, 257/12, 13
See application file for complete search history.

(56) References Cited

U.S. PATENT DOCUMENTS
6,165,812 A 12/2000 Ishibashi et al.
2009/0286063 A2 * 11/2009 Dmitriev et al. ............. 428/220

FOREIGN PATENT DOCUMENTS
JP 11-354846 A 12/1999
JP 2004-096021 A 3/2004
JP 2005-210091 A 8/2005
JP 2005-244202 A 9/2005
* cited by examiner Primary Examiner — Samuel Gebremariam
(74) Attorney, Agent, or Firm — Sughrue Mion, PLLC

(57) ABSTRACT

An object of the present invention is to obtain a group III nitride compound semiconductor stacked structure where a group III nitride compound semiconductor layer having good crystallinity is stably stacked on a dissimilar substrate.

The group III nitride compound semiconductor stacked structure of the present invention is a group III nitride compound semiconductor stacked structure comprising a substrate having provided thereon a first layer comprising a group III nitride compound semiconductor and a second layer being in contact with the first layer and comprising a group III nitride compound semiconductor, wherein the first layer contains a columnar crystal with a definite crystal interface and the columnar crystal density is from $1 \times 10^3$ to $1 \times 10^5$ crystals/$\mu m^2$.

27 Claims, 8 Drawing Sheets

GROUP III NITRIDE COMPOUND SEMICONDUCTOR STACKED STRUCTURE

TECHNICAL FIELD

The present invention relates to a group III nitride compound semiconductor (hereinafter, the group III nitride compound semiconductor is denoted by AlGaInN) stacked structure with good crystallinity, which is used for the production of a light-emitting diode (LED), a laser diode (LD), an electronic device and the like, and a production method thereof. More specifically, the present invention relates to a group III nitride compound semiconductor stacked structure that can be suitably used for epitaxially growing a group III nitride compound semiconductor crystal with good crystallinity on a sapphire substrate, and a production method thereof.

BACKGROUND ART

The group III nitride compound semiconductor can realize high-efficiency light emission because of its direct-transition type bandgap energy corresponding to a region from visible to ultraviolet and therefore, is produced as an LED or LD. It is therefore possible to produce an electronic device having properties unachievable by conventional group III-V compound semiconductors.

A single crystal wafer of a group III-V compound semiconductor is not yet commercially available, and a method of growing a crystal of a group III-V compound semiconductor on a single crystal wafer of a different material is generally employed. A large lattice mismatch is present between such a dissimilar substrate and a group III nitride compound semiconductor crystal epitaxially grown thereon. For example, there is a lattice mismatch of 16% between sapphire ($Al_2O_3$) and gallium nitride (GaN) and 6% between SiC and gallium nitride. In general, the presence of such a large lattice mismatch makes it difficult to epitaxially grow a crystal directly on the substrate and even when a crystal is grown, a crystal with good crystallinity cannot be obtained. Accordingly, in the case of epitaxially growing a group III nitride compound semiconductor crystal on a sapphire single crystal substrate or an SiC single crystal substrate by the metal-organic chemical vapor deposition (MOCVD) method, there is generally employed a method where, as disclosed in Japanese Patent No. 3,026,087 and Japanese Unexamined Patent Publication No. 4-297023, a layer called a low-temperature buffer layer composed of aluminum nitride (AlN) or AlGaN is first deposited on the substrate and the group III nitride compound semiconductor crystal is then epitaxially grown thereon at a high temperature.

Furthermore, a technique using a columnar crystal texture layer as the buffer layer is described in Unexamined Patent Publication No. 2003-243302 and *Journal of Crystal Growth*, Vol. 115, pp. 628-633 (1991). The technique disclosed in these publications uses the MOCVD method for the growth, similarly to conventional techniques above. The MOCVD method is suitable to form a high-quality crystal film at a high growth rate, but for the formation with good uniformity of a film having a structure such as columnar crystal, a growth method using a plasmatized metal raw material, such as sputtering, is suited. The above publications are silent on the columnar crystal density.

On the other hand, as regards the technique of growing a buffer layer by a method other than MOCVD, several reports have been made. For example, Japanese Examined Patent Publication No. 5-86646 describes a technique of growing a buffer layer by high-frequency sputtering and growing thereon a crystal having the same composition by MOCVD. However, Japanese Patent Nos. 3,440,873 and 3,700,492 reveal that a good crystal cannot be stably obtained only by the technique described in Japanese Examined Patent Publication No. 5-86646. For stably obtaining a good crystal, it is important, as described in Japanese Patent No. 3,440,873, to anneal the grown buffer layer in a mixed gas composed of ammonia and hydrogen, or as described in Japanese Patent No. 3,700,492, to film-form the buffer layer at a temperature of 400° C. or more by DC sputtering.

However, these patent publications are silent on what crystallinity is preferred for the layer that is film-formed on the substrate. In practice, according to the results in intensive experiments performed by the present inventors, a group III nitride compound semiconductor crystal cannot be stably obtained as a good crystal only under the conditions described in the patent publications above.

As for the substrate, Japanese Patent Nos. 3,440,873 and 3,700,492 recite sapphire, silicon, silicon carbide, zinc oxide, gallium phosphide, gallium arsenide, magnesium oxide, manganese oxide, a group III nitride-based compound semiconductor single crystal and the like, and it is stated that above all, an a-plane sapphire substrate is most matched.

DISCLOSURE OF THE INVENTION

An object of the present invention is, in forming a group III nitride compound semiconductor layer, to stably obtain a group III nitride compound semiconductor layer having good crystallinity by using a buffer layer having a controlled structure.

Another object of the present invention is to provide an efficient production method of the buffer layer having a controlled structure.

The present invention provides the following inventions.

(1) A group III nitride compound semiconductor stacked structure comprising a substrate having provided thereon a first layer comprising a group III nitride compound semiconductor and a second layer being in contact with the first layer and comprising a group III nitride compound semiconductor, wherein the first layer contains a columnar crystal with a definite crystal interface and the columnar crystal density is from $1\times10^3$ to $1\times10^5$ crystals/$\mu m^2$.

(2) The group III nitride compound semiconductor stacked structure according to (1) above, wherein the first layer covers at least 90% of the substrate surface.

(3) The group III nitride compound semiconductor stacked structure according to (1) or (2) above, wherein the width of the columnar crystal with a definite crystal interface is from 1 to 50 nm.

(4) The group III nitride compound semiconductor stacked structure according to (3) above, wherein the width of the columnar crystal with a definite crystal interface is from 2 to 30 nm.

(5) The group III nitride compound semiconductor stacked structure according to any one of (1) to (4) above, wherein the thickness of the first layer is from 10 to 500 nm.

(6) The group III nitride compound semiconductor stacked structure according to (5) above, wherein the thickness of the first layer is from 20 to 100 nm.

(7) The group III nitride compound semiconductor stacked structure according to any one of (1) to (6) above, wherein the first layer is an Al-containing group III nitride compound semiconductor.

(8) The group III nitride compound semiconductor stacked structure according to (7) above, wherein the first layer comprises AlN.

(9) The group III nitride compound semiconductor stacked structure according to any one of (1) to (8) above, wherein the second layer is AlGaN.

(10) The group III nitride compound semiconductor stacked structure according to any one of (1) to (8) above, wherein the second layer is GaN.

(11) The group III nitride compound semiconductor stacked structure according to any one of (1) to (10) above, wherein the group III nitride compound semiconductor forming the first layer and the group III nitride compound semiconductor forming the second layer are different materials.

(12) The group III nitride compound semiconductor stacked structure according to (11) above, wherein the first layer is AlN and the second layer is GaN.

(13) The group III nitride compound semiconductor stacked structure according to any one of (1) to (12) above, wherein the substrate is composed of a material selected from the group consisting of sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten and molybdenum.

(14) A method for producing a group III nitride compound semiconductor stacked structure, comprising growing, on a substrate, a first layer comprising a columnar crystal of group III nitride compound semiconductor by activating a group III metal raw material and a nitrogen element-containing gas with a plasma to cause a reaction therebetween, and then growing a second layer being in contact with the first layer and comprising a group III nitride compound semiconductor.

(15) The method for producing a group III nitride compound semiconductor stacked structure according to (14) above, wherein the growth method of the first layer is at least one member selected from the group consisting of sputtering, PLD, PED and CVD.

(16) The method for producing a group III nitride compound semiconductor stacked structure according to (15) above, wherein the growth method of the first layer is sputtering.

(17) The method for producing a group III nitride compound semiconductor stacked structure according to (16) above, wherein the growth method of the first layer is reactive sputtering performed while flowing a nitrogen source in the reactor.

(18) The method for producing a group III nitride compound semiconductor stacked structure according to (17) above, wherein the growth method of the first layer is sputtering utilizing ammonia as the nitrogen source.

(19) The method for producing a group III nitride compound semiconductor stacked structure according to (17) above, wherein the growth method of the first layer is sputtering utilizing a nitrogen gas as the nitrogen source.

(20) The method for producing a group III nitride compound semiconductor stacked structure according to any one of (16) to (19) above, wherein the growth method of the first layer is RF sputtering.

(21) The method for producing a group III nitride compound semiconductor stacked structure according to (20) above, wherein the growth method of the first layer is RF sputtering performed while moving the position of the magnet in the cathode.

(22) The method for producing a group III nitride compound semiconductor stacked structure according to any one of (16) to (21) above, wherein the substrate temperature at the growth of the first layer is from 400 to 800° C.

(23) The method for producing a group III nitride compound semiconductor stacked structure according to any one of (14) to (22) above, wherein the growth method of the second layer is MOCVD.

(24) The method for producing a group III nitride compound semiconductor stacked structure according to any one of (14) to (22) above, wherein the growth method of the second layer is reactive sputtering.

(25) The method for producing a group III nitride compound semiconductor stacked structure according to any one of (14) to (24) above, wherein the substrate temperature at the growth of the second layer is 900° C. or more.

(26) A group III nitride compound semiconductor light-emitting device comprising the group III nitride compound semiconductor stacked structure according to any one of (1) to (13) above.

(27) A lamp comprising the group III nitride compound semiconductor light-emitting device according to (26) above.

The group III nitride compound semiconductor stacked structure of the present invention has a surface layer composed of a group III nitride compound semiconductor with good crystallinity and therefore, a group III nitride compound semiconductor device such as LED produced using the stacked structure has good properties. Also, the production method of a group III nitride compound semiconductor stacked structure of the present invention forms the first layer by activating the raw material with a plasma, so that a crystal film with good uniformity can be obtained in a short time and the productivity can be improved.

BEST MODE FOR CARRYING OUT THE INVENTION

In the group III nitride compound semiconductor stacked structure of the present invention, at the time of epitaxially growing a group III nitride compound semiconductor crystal on a substrate, a layer containing a columnar crystal with a distinct crystal interface is used as a first layer on the substrate. The distinct interface of the columnar crystal plays the role of a seed crystal for the generation of a second layer film-formed directly thereon and enables generation of seed crystals at an appropriate density. In the process of the generated seed crystal gradually growing in the transverse direction, dislocations are looped and decrease, so that a layer with low dislocation and good crystallinity can be formed.

It may be considered that a step is produced in the interface of the columnar crystal and works out to an active point to allow for generation of a seed crystal or a fine gap is produced in the interface portion and works out to an active point to allow for generation of a seed crystal. Details of the mechanism by which the seed crystal is produced have not been identified yet.

The columnar crystal with a definite crystal interface as used in the present invention indicates a crystal grain having a distinct crystal interface and showing a hexagon-based cross-sectional shape when viewed from the planar direction. This crystal grain may fill the whole layer or may be interspersed in a layer not having a distinct crystal interface.

Figure 3:
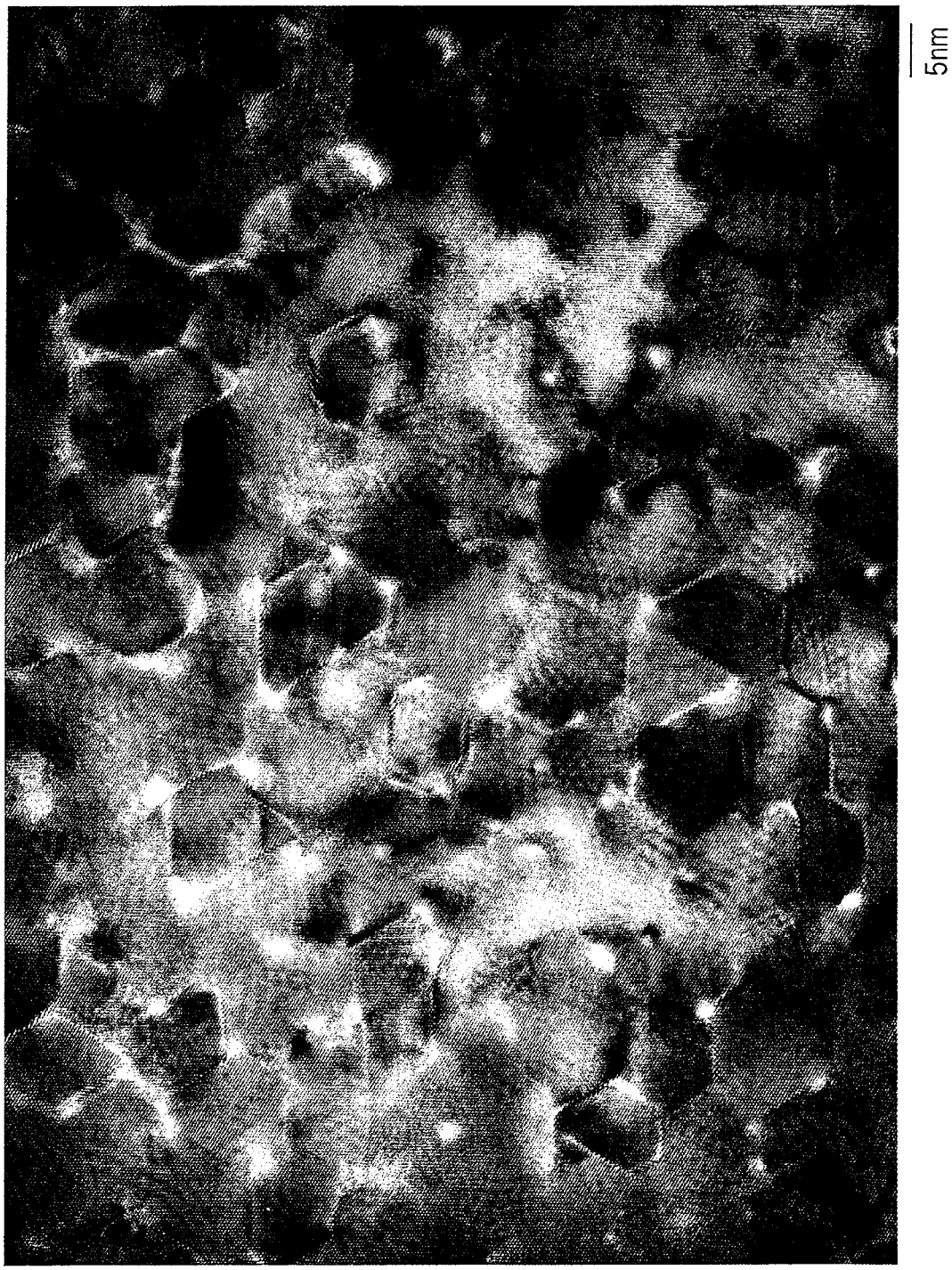
FIG. 3 is a plan-view image of TEM of the first layer of the group III nitride compound semiconductor stacked structure produced in Example 1 of the present invention.
Figure 4:
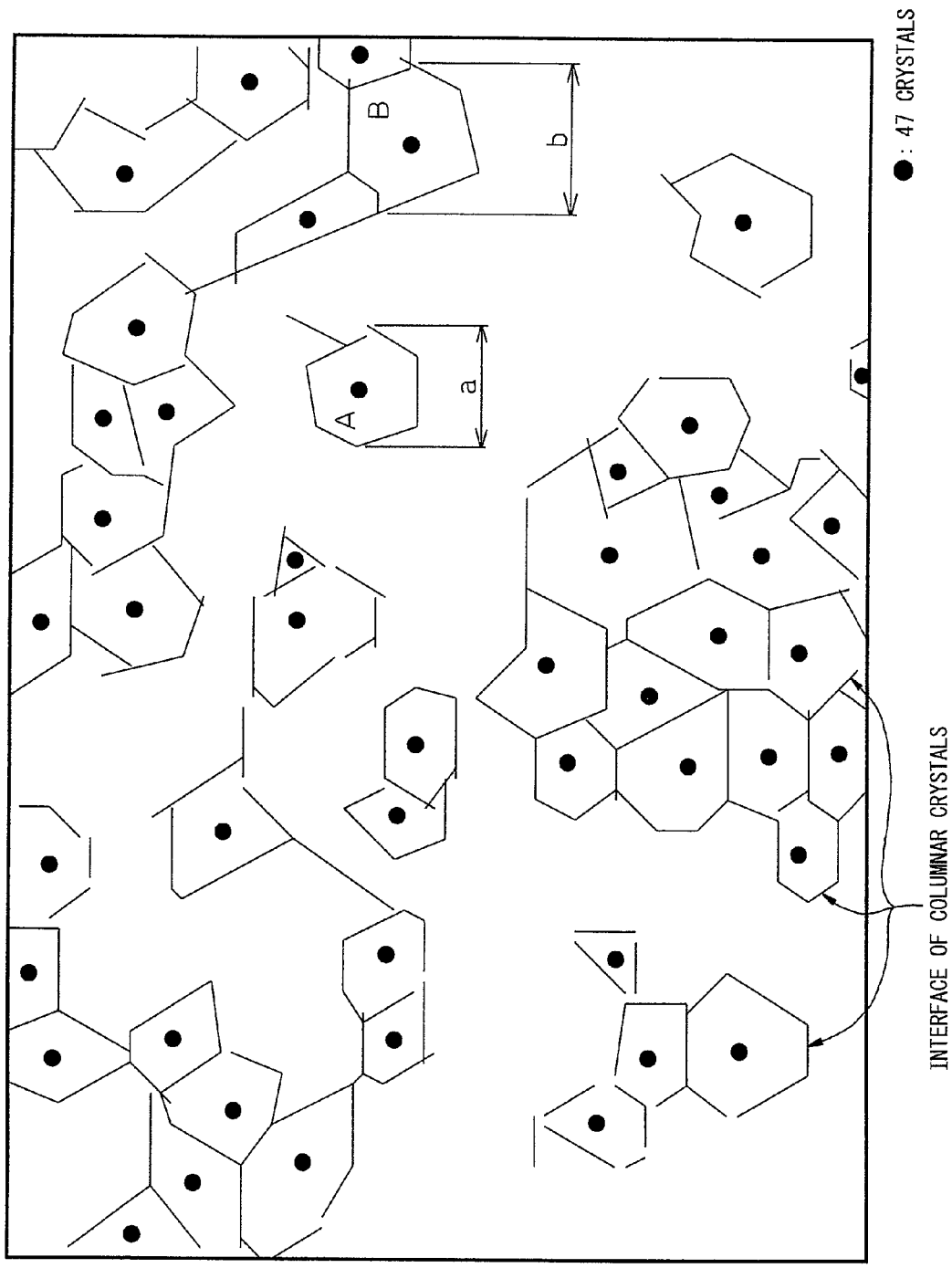
FIG. 4 is a view schematically showing FIG. 3.

FIG. 3 is a TEM photograph when the first layer of the group III nitride compound semiconductor stacked structure produced in Example 1 of the present invention is viewed from the planar direction. FIG. 4 is a view schematically showing FIG. 3. It is seen that crystal grains each having a hexagon-based cross-sectional shape and being surrounded by a distinct crystal interface are scattered in a crystal layer not having a distinct interface. The size is, in terms of the diameter, approximately from 5 to 10 nm, and the density is about 5,000 crystals in a square surrounded by 1 μm sides (the photograph shows a range of 85 nm×120 nm, where 47 columnar crystals with a distinct crystal interface are seen).

In the technique disclosed in the context of the present invention, the preferred density of columnar crystals with a distinct crystal interface is approximately from 1,000 to 100,000 crystals in a square surrounded by 1 μm sides. If the density exceeds this range, the layer comes to contain too many crystal interfaces, which corresponds to low crystallinity, as a result, the crystallinity of the second layer is not enhanced, and if the density is less than the range above, the crystallinity of the second layer is also not enhanced due to too few crystal interfaces. The density is more preferably from 1,500 to 50,000 crystals, still more preferably from 2,000 to 10,000 crystals.

Figure 7:
FIG. 7 is a plan-view image of TEM of the first layer of the group III nitride compound semiconductor stacked structure produced in Comparative Example of the present invention.
Figure 8:
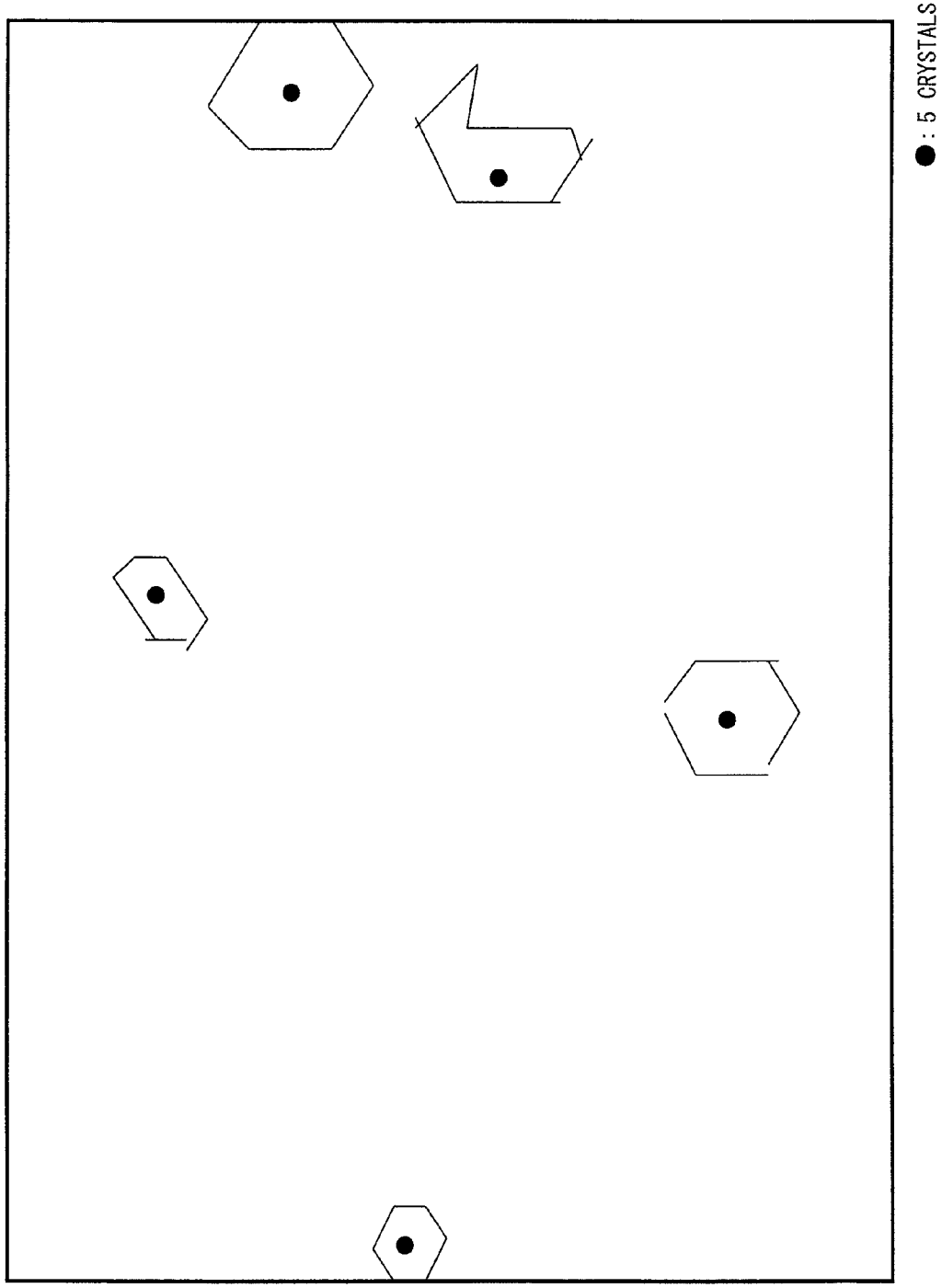
FIG. 8 is a view schematically showing FIG. 7.

For example, FIG. 7 is a TEM photograph of the first layer of the group III nitride compound semiconductor stacked structure produced in Comparative Example 1 of the present invention, and FIG. 8 is a view schematically showing FIG. 7. In the case where an AlN crystal layer containing only about 500 columnar crystals with a distinct interface in 1 μm$^2$ as in the TEM image shown in FIG. 7 is used as the first layer, a second layer with good crystallinity cannot be obtained. In a bad case, the second layer fails in having a mirror surface but becomes white turbid. In an LED fabricated from such a group III nitride compound semiconductor stacked structure, the n-type layer, light-emitting layer and p-type layer stacked on the structure also come to have poor crystallinity and current leakage is generated, resulting in deterioration of ESD durability and aging characteristics.

As described above, whether the columnar crystal contained in the first layer is a columnar crystal having a distinct interface or not can be judged from the plan-view image of TEM, and the density of the columnar crystal can also be measured from the plan-view image of TEM.

Figure 5:
FIG. 5 is a cross-sectional-view image of TEM of the group III nitride compound semiconductor stacked structure produced in Example 1 of the present invention.
Figure 6:
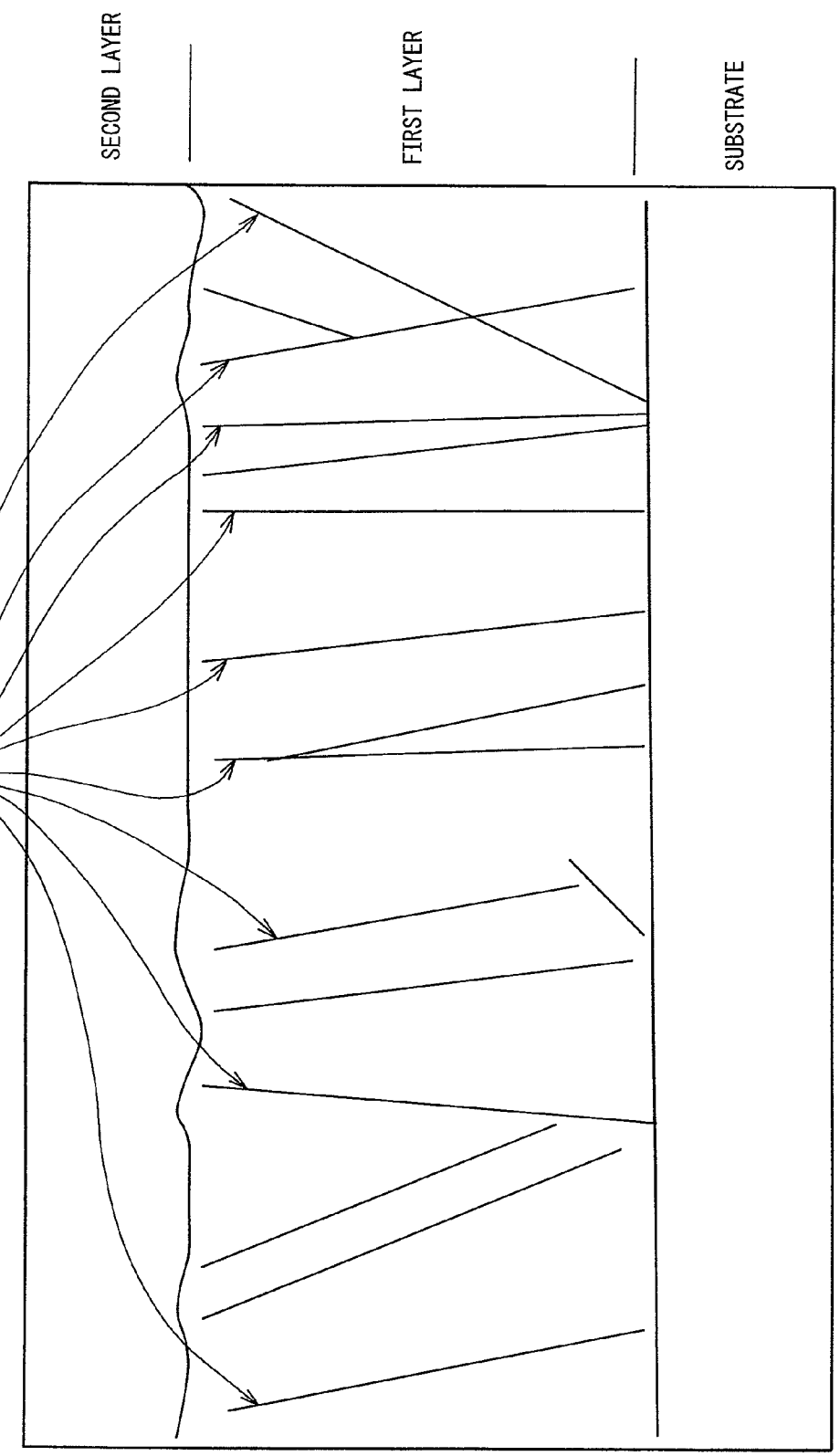
FIG. 6 is a view schematically showing FIG. 5.

Incidentally, the columnar crystal indicates a crystal with its longitudinal cross-sectional shape being columnar, and whether columnar or not can be judged from the cross-sectional-view image of TEM. FIG. 5 is a TEM photograph showing the cross section at almost the same position as FIG. 3 of the group III nitride compound semiconductor stacked structure produced in Example 1 of the present invention, and FIG. 6 is a view schematically showing FIG. 5. The first layer is divided by interfaces shown by solid lines in FIG. 6, and individual crystalline lumps each between an interface and an interface have a hexagonal columnar shape.

The crystal layer containing many columnar crystals with a distinct crystal interface means an aggregate of crystals, where crystal lattice planes are well aligned with respect to the substrate plane. In the case of an aggregate of crystals where crystal lattice planes are tilted little by little with respect to the substrate plane, crystals can be continuously connected to each other, resulting in an aggregate allowing for no distinct crystal interface.

Such a crystallinity property is reflected on the results of X-ray measurement. In the case where the lattice constant of (0002) plane parallel to the substrate is measured by a general double crystal X-ray rocking curve, when the half-width is small, this comes under the aggregate specified in the present invention, that is, an aggregate containing many columnar crystals with a distinct crystal interface. Accordingly, the half-width in the X-ray rocking curve measurement of (0002) plane of the first layer is preferably 0.5° or less, more preferably 0.1° or less.

In the present invention, for allowing the second layer to have good crystallinity, individual crystal grains of columnar crystal needs to be controlled to an appropriate width. More specifically, the width of each columnar crystal is preferably a value between 0.1 nm and 100 nm, more preferably a value between 1 nm and 70 nm. Furthermore, since the density of crystal interfaces of columnar crystal is important, the size of the columnar crystal is preferably in a certain range so that the crystal interface density can fall within an appropriate range. For example, the width of each columnar crystal is preferably a value between 1 nm and 50 nm, more preferably a value between 2 nm and 30 nm, still more preferably a value between 3 nm and 20 nm.

The width of each columnar crystal can be easily measured from the plan-view image of TEM above. That is, in FIG. 4, the diameter of each columnar crystal is the width of each columnar crystal. For example, the width of the columnar crystal A is a, and the width of the columnar crystal B is b. As seen from FIG. 3, the width of each columnar crystal cannot be precisely specified and has a distribution to a certain extent. Accordingly, even when a crystal deviating from the above-described range of the width of each columnar crystal is present approximately in several %, the effect of the present invention is not affected. It is preferred that 90% or more of columnar crystals have a width falling in the above-described range.

The thickness of the first layer is preferably from 10 to 500 nm. If the thickness is less than this range, the layer cannot sufficiently fulfill the function as a buffer layer, whereas even if the thickness exceeds the range above, no change is yielded in the function and the processing time is uselessly prolonged. The layer thickness is more preferably from 20 to 100 nm. The thickness of the first layer can also be easily measured from the cross-sectional-view image of TEM above.

The first layer (buffer layer) comprising such a columnar crystal preferably gaplessly covers the substrate. If the first layer does not cover the substrate and even a part of the substrate surface is exposed, a uniform crystal is not grown because the crystal lattice constant differs between the second layer film-formed on the first layer and the second layer film-formed directly on the substrate. As a result, hillocks or pits are produced.

Accordingly, the first layer needs to cover at least 60%, preferably 80% or more, most preferably 90% or more, of the substrate surface.

The ratio in which the first layer covers the substrate can be measured from the cross-sectional-view image of TEM above. In particular, when the materials of first layer and second layer are different, the interface between the substrate and the layer is scanned in parallel to the substrate plane by using EDS or the like, whereby the ratio of the region where the first layer is not formed can be estimated. After preparing a sample where only the first layer is film-formed, the area of the exposed substrate can be measured by means of AFM or the like. In the present invention, the ratio was measured from the cross-sectional-view image of TEM above.

As for the material constituting the first layer, any material may be used as long as it is a group III nitride compound semiconductor represented by formula AlGaInN. Furthermore, the material may contain, as group V, As or P. However, above all, a composition containing Al is preferably formulated, and GaAlN is particularly preferred, where the proportion of Al is suitably 50% or more. Furthermore, because of AlN, a columnar crystal aggregate can be efficiently yielded, which is more advantageous.

As for the growth method of the first layer, a method generally known as a crystal growth method of a group III nitride compound semiconductor can be utilized without any problem. Examples of the crystal growth method generally employed include an MOCVD method, an MBE method, a sputtering method and an HVPE method.

In particular, a method of activating a group III metal raw material and a nitrogen element-containing gas as a plasma to cause a reaction therebetween is preferred, because a columnar crystal with a distinct crystal interface is readily produced.

As for the growth method of plasmatizing a group III metal raw material, sputtering, PLD, PED, CVD and the like are known. The method for generating a plasma includes a sputtering method of causing discharge by applying a high voltage at a specific vacuum, a PLD method of generating a plasma by irradiating a laser at a high energy density, and a PED method of generating a plasma by irradiating an electron beam. Among these, a sputtering method is most simple, allows a columnar crystal with a distinct crystal interface to be readily produced at an appropriate density and is suited also for mass production and therefore, this method is preferred. Since DC sputtering incurs charge-up on the target surface and has a high probability of failing in stabilizing the growth rate, the sputtering method is preferably pulse DC sputtering or RF sputtering.

In the sputtering method, a technique of increasing the efficiency by confining a plasma in the magnetic field is generally used in practice, and for avoiding charge-up, the position of the magnet is preferably moved within the target. The specific method for movement can be selected according to the apparatus, and for example, the magnet may be swung or rotated. By such an operation, a first layer having a columnar crystal with a distinct crystal interface at an appropriate density can be film-formed.

In experiments by the present inventors, it has been found that the substrate temperature at the growth is preferably from 300 to 800° C. At a temperature less than this range, the first layer cannot cover the entire surface of the substrate and the substrate surface may be exposed, whereas at a temperature exceeding the range above, the metal raw material undergoes aggressive migration, making it difficult to form a columnar crystal with a distinct crystal interface, and the layer formed is not suitable as the first layer. The substrate temperature is more preferably from 400 to 800° C.

In the case of growing the first layer by using a sputtering method, important parameters other than the substrate temperature are the pressure in furnace and the nitrogen partial pressure. The pressure in furnace is preferably 0.3 Pa or more. Under a pressure less than this range, the nitrogen abundance is small and the sputtered metal adheres without becoming a nitride. The upper limit of the pressure is not particularly specified but needless to say, the pressure needs to be low enough to enable generation of a plasma. The ratio of the nitrogen flow rate to the flow rate of nitrogen and argon is preferably from 20 to 90%. At a flow rate ratio less than this range, the sputtered metal adheres as a metal as it is, whereas at a flow rate ratio exceeding the range above, the amount of argon is small and the sputtering rate decreases. The flow rate ratio is more preferably from 25 to 70%.

By applying these conditions, a first layer where a columnar crystal with a distinct crystal interface is contained at a preferred density can be film-formed.

The growth rate is preferably from 0.01 to 10 nm/sec. At a speed exceeding this range, the film does not become crystalline but becomes amorphous, and at a growth rate less than the range above, the film does not become a layer but grows in an island mode and cannot cover the substrate surface.

In the case of growing a mixed crystal as the first layer by using a growth method of plasmatizing a group III metal raw material, there may be employed a method where the metal as a target is a mixture of metal materials (need not always form an alloy) from the start, or a method where two targets are prepared using different materials and simultaneously sputtered. In general, a mixed material is used as the target when forming a film with a determined composition, and a plurality of targets are set in a chamber when forming several kinds of films differing in the composition.

As regards the nitrogen raw material for use in the present invention, a generally known compound may be used without any problem, but ammonia and nitrogen are particularly preferred because these are easy to handle and available at a relatively low cost. Ammonia decomposes with good efficiency and enables growth at a high growth rate, but its reactivity or toxicity is high and it needs to be coped with, for example, equipment for safety disposal or gas detector is required or a material having high chemical stability must be employed for a member used in the reaction apparatus. Conversely, when nitrogen is used as the raw material, the apparatus can be simple but a high reaction rate cannot be obtained. In a method of introducing nitrogen after decomposition by electric field, heat or the like, a growth rate high enough to be utilizable can be obtained, though inferior to ammonia, and in view of balance with the apparatus cost, this is a most suitable nitrogen source.

The material constituting the second layer needs not be the same as that of the first layer.

The experiment by the present inventors showed that a group III nitride containing Ga is preferred as the material of the second layer. In order not to directly take over the crystallinity of the first layer that is an aggregate of columnar crystals with a distinct crystal interface, dislocations need to be looped by migration, and the material likely to cause looping of dislocations is Ga-containing nitride. In particular, AlGaN is preferred, and GaN is also suitable.

The thickness of the second layer is not particularly limited but in general, the thickness is preferably from 0.5 to 20 μm. If the thickness is less than 0.5 μm, insufficient looping of dislocations may result, whereas even if the thickness exceeds 20 μm, no change is yielded in the function and the processing time is uselessly prolonged. The layer thickness is more preferably from 1 to 15 μm.

The second layer may take a structure doped with a dopant, if desired, or may have an undoped structure. In the case of using an electrically conductive substrate, it is preferred to fabricate a structure where the second layer is doped to create a layer structure allowing for flow of a current in the longitudinal direction and both surfaces of a chip are provided with an electrode. In the case of using an insulating substrate, the chip structure becomes such that electrodes are formed on the same surface of a chip, and therefore, good crystallinity may be obtained by using an undoped crystal for the layer immediately on the substrate.

The method for stacking the second layer is not particularly limited. There is no problem as long as it is a crystal growth technique capable of causing the above-described looping of dislocations. In particular, an MOCVD method, an MBE method and a VPE method are suitable, because these methods in general can produce such migration and a film with good crystallinity can be formed. Above all, an MOCVD method can form a film with the best crystallinity and is preferred.

The second layer can also be film-formed using a sputtering method. In the case of a sputtering method, the apparatus can be simple as compared with an MOCVD method or an MBE method.

Annealing after the growth of the first layer and before growing the second layer is not particularly necessary.

However, in the case where second growth is performed by a gas phase chemical growth method such as MOCVD, MBE and VPE, a temperature raising process not involving growth and a temperature stabilizing process are generally passed through. In these processes, a group V raw material gas is flowed in many cases, as a result, an annealing effect may be produced, but this is not to utilize the annealing effect in particular, but is a generally known technique.

For the carrier gas, a general gas can be used without problems, i.e., hydrogen or nitrogen widely used in the gas phase chemical growth method such as MOCVD may be used. However, a temperature rise in relatively chemically active hydrogen may impair crystallinity or flatness of the crystal surface and is preferably not allowed to continue for a long period of time.

The substrate temperature at the growth of the second layer is preferably 800° C. or more, because when the substrate temperature is high, migration of atoms is likely to occur and looping of dislocations may readily occur. The substrate temperature is more preferably 900° C. or more, still more preferably 1,000° C. or more.

The growth needs to be of course performed at a temperature lower than the temperature causing decomposition of the crystal, and a temperature of 1,200° C. or more is improper as the growth temperature of the second layer.

As for the substrate which can be used in the present invention, in general, any material may be used as long as it is a substrate on which a group III nitride compound semiconductor crystal can be film-formed. Examples thereof include sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten and molybdenum.

When a first layer is film-formed without using ammonia and a second layer is film-formed by a technique using ammonia, even for an oxide substrate, metal substrate or the like known to cause chemical modification due to contact with ammonia at a high temperature, the above-described method can be utilized as an effective growth method, because the first layer acts as a coat layer and produces an effect of preventing chemical modification.

The substrate is preferably subjected to a wet pretreatment. For example, in the case of a silicon substrate, when well-known RCA cleaning or the like is applied and the surface is hydrogen-terminated, a stable process is achieved.

On the other hand, after introduction into a reaction chamber, a pretreatment may be performed using a method such as sputtering. More specifically, the surface can be conditioned by the exposure to a plasma of Ar or $N_2$. For example, by causing a plasma of Ar gas, $N_2$ gas or the like to act on the substrate surface, an organic material or an oxide attached to the surface can be removed. In this case, a voltage is applied between the substrate and the chamber, whereby the plasma particle effectively acts on the substrate.

On the second layer, a semiconductor stacked structure having functionality may be stacked to fabricate various semiconductor devices.

For example, in the case of forming a stacked structure for a light-emitting device, the structure includes an n-type electrically conductive layer doped with an n-type dopant such as Si, Ge and Sn, and a p-type electrically conductive layer doped with a p-type dopant such as magnesium. With respect to the material, InGaN is widely used for the light-emitting layer and the like, and AlGaN is used for the cladding layer and the like.

As for the device, the stacked structure may be used for a photoelectric conversion device such as laser device and light-receiving device, an electronic device such as HBT and HEMT, and the like, in addition to the light-emitting device. Regarding these semiconductor devices, a large number of devices having various structures are known, and the group III nitride compound semiconductor stacked structure of the present invention is not limited in the device structure stacked on the second layer, including these well-known device structures.

Particularly, in the case of a light-emitting device, an device produced by this technique may be packaged and used as a lamp. A technique of changing the emission color by combining the device with a phosphor is known, and this technique can be utilized without any problem. For example, light emission at a wavelength longer than the light-emitting device may be obtained by appropriately selecting the phosphor, and a white light-emitting package may be fabricated by mixing the emission wavelength of the light-emitting device itself with the wavelength after conversion by the phosphor.

EXAMPLES

The present invention is described in greater detail below by referring to Examples, but the present invention is not limited only to these Examples.

Example 1

In this Example, a layer containing a columnar crystal composed of AlN with a distinct crystal interface was formed as a first layer on a c-plane sapphire substrate by an RF sputtering method, and a layer composed of GaN was formed thereon as a second layer by an MOCVD method.

First, a c-plane sapphire substrate with only one surface being mirror-polished to such an extent as usable for the epitaxial growth was introduced into a sputtering machine without particularly performing a wet pretreatment. The sputtering machine used has a high-frequency power source and a mechanism enabling the magnet position to move within the target.

The substrate was heated to 750° C. in the sputtering apparatus and after introducing a nitrogen gas at a flow rate of 15 sccm, a high-frequency bias of 50 W was applied to the substrate side while keeping the pressure inside of the chamber at 0.08 Pa, whereby the substrate surface was cleaned through exposure to nitrogen plasma.

Subsequently, argon and nitrogen gases were introduced and the substrate temperature was then lowered to 500° C. A high-frequency bias of 2,000 W was applied to the metal Al target side and while keeping the pressure in the furnace at 0.5 Pa, AlN was film-formed on the sapphire substrate under the conditions of flowing an Ar gas at 15 sccm and a nitrogen gas at 5 sccm (the ratio of nitrogen to the entire gas was 25%). The growth rate was 0.12 nm/s.

The magnet within the target was allowed to swing during substrate cleaning and growth.

After the growth of AlN to 50 nm, generation of a plasma was stopped and the substrate temperature was lowered.

The substrate was taken out from the sputtering machine and introduced into an MOCVD furnace.

After the introduction, a sample containing a GaN layer was produced by using an MOCVD method through the following procedure. First, the sapphire substrate was introduced into a reaction furnace. The sapphire substrate was placed on a carbon-made susceptor for heating in a glove box displaced with nitrogen gas.

A nitrogen gas was flowed and the substrate temperature was then raised to 1,150° C. by actuating a heater. After confirming that the temperature was stabilized at 1,150°, the valve of ammonia tubing was opened and flow of ammonia into the furnace was started. Subsequently, hydrogen containing trimethyl gallium (TMGa) vapor was fed into the reaction furnace and a step of attaching a group III nitride compound semiconductor constituting the second layer onto the sapphire substrate was started. The amount of ammonia was adjusted to give a group V element/group III element ratio of 6,000. The GaN layer was allowed to grow over about 1 hour and thereafter, the valve of TMGa tubing was switched to terminate the feed of the raw material to the reaction furnace, whereby the growth was stopped. After the completion of growth of the GaN layer, power distribution to the heater was stopped, and the substrate temperature was lowered to room temperature.

Through the process above, a group III nitride compound semiconductor stacked structure of the present invention was produced, where a first layer of AlN having a columnar crystal structure with a distinct crystal interface was formed on the sapphire substrate and an undoped 2 μm-thick GaN layer was formed thereon. The substrate taken out was in a colorless transparent mirror state.

The undoped GaN layer grown by the method above was measured for the four-crystal X-ray rocking curve (XRC). As a result of this measurement, the undoped GaN layer produced by the method of the present invention showed a half-width of 50 arcsec in the measurement of (0002) plane and a half-width of 250 arcsec for (10-10) plane.

The cross section of the stacked structure obtained was observed by a transmission electron microscope (TEM). FIG. 5 is the TEM photograph, and FIG. 6 is a view schematically showing FIG. 5. As seen from these Figures, the first layer composed of an AlN film having many crystal interfaces in the direction nearly perpendicular to the substrate plate was observed between the sapphire substrate and the second layer composed of gallium nitride. The film thickness was about 50 nm. This layer is considered to be a layer containing a vertically long columnar crystal. The first layer covered the entire surface of the substrate.

Furthermore, a sample where only a first layer was film-formed in the same chamber at the growth of a first layer by sputtering was produced. The plane surface of the AlN layer of the obtained sample was observed by a transmission electron microscope (TEM). FIG. 3 is the TEM photograph, and FIG. 4 is a view schematically showing FIG. 3. As seen from these Figures, the first layer contains a hexagonal columnar crystal having a distinct crystal interface and having a size of approximately from 5 to 10 nm at a density of about $5 \times 10^3$ crystals/μm².

The same sample was measured for the double crystal X-ray rocking curve of the first layer and found to show a half-width of 0.07° in the measurement of (0002) plane.

Example 2

Figure 1:
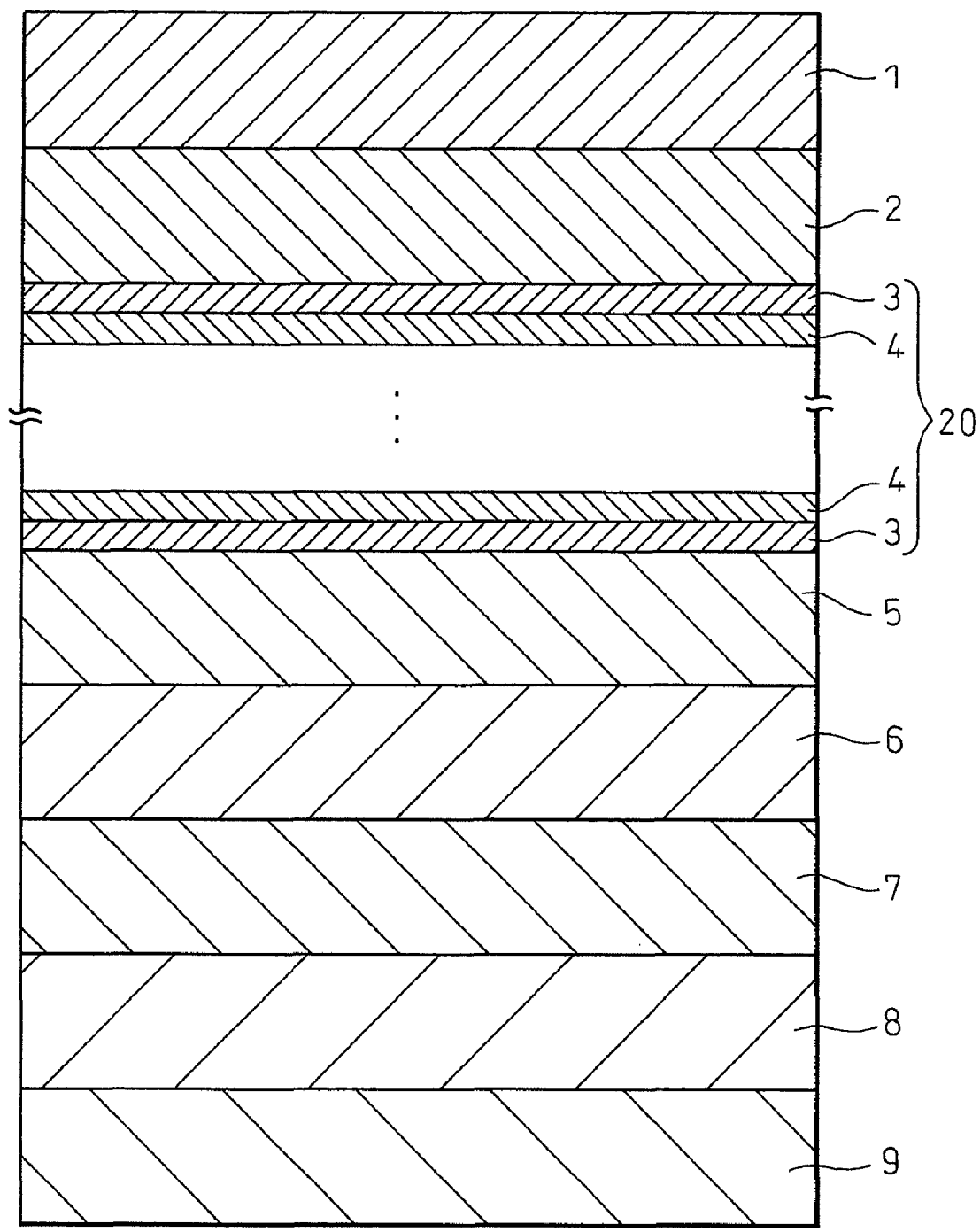
FIG. 1 is a schematic view showing the cross section of the epitaxial wafer having an epitaxial layer structure for a semiconductor light-emitting device produced in Example 2 of the present invention.

In this Example, production of a group III nitride compound semiconductor light-emitting device using the group III nitride compound semiconductor stacked structure of the present invention is described. In this Example, an epitaxial wafer having an epitaxial layer structure for a semiconductor light-emitting device, shown in FIG. 1, was finally produced, for example, by growing an n-type contact layer using Si as the dopant on an undoped GaN crystal (second layer) produced over 6 μm under the same conditions as in Example 1. More specifically, the epitaxial wafer has a structure where on a 50 nm-thick AlN layer 8 (first layer) containing a columnar crystal structure with a distinct crystal interface and being formed on a sapphire substrate 9 having a c-plane by the same growth method as described in Example 1, a 6 μm-thick undoped GaN layer 7 (second layer), a 2 μm-thick Si-doped GaN layer 6 having an electron concentration of $1 \times 10^{19}$ cm$^{-3}$, a 200 Å-thick $In_{0.1}Ga_{0.9}N$ cladding layer 5 having an electron concentration of $1 \times 10^{18}$ cm$^{-3}$, a multiple quantum well structure 20 starting with a GaN barrier layer and ending with a GaN barrier layer, that is composed of six GaN barrier layers 3 having a layer thickness of 160 Å and five non-doped $In_{0.2}Ga_{0.8}N$ well layers 4 having a layer thickness of 30 U, a 50 Å-thick Mg-doped $Al_{0.1}Ga_{0.9}N$ cladding layer 2, and a 0.2 μm-thick Mg-doped $Al_{0.02}Ga_{0.98}N$ layer 1 are stacked in this order from the substrate side.

In producing a wafer having epitaxial layers of the semiconductor light-emitting device structure above, the Si-doped GaN layer 6 and subsequent layers were stacked in the same manner as the growth of the second layer in Example 1 by using the same MOCVD apparatus as used in Example 1.

Through such a procedure, an epitaxial wafer having an epitaxial layer structure for a semiconductor light-emitting device was produced. Here, the Mg-doped $Al_{0.02}Ga_{0.98}N$ layer exhibited p-type characteristics even without performing an annealing treatment for activating a p-type carrier.

Figure 2:
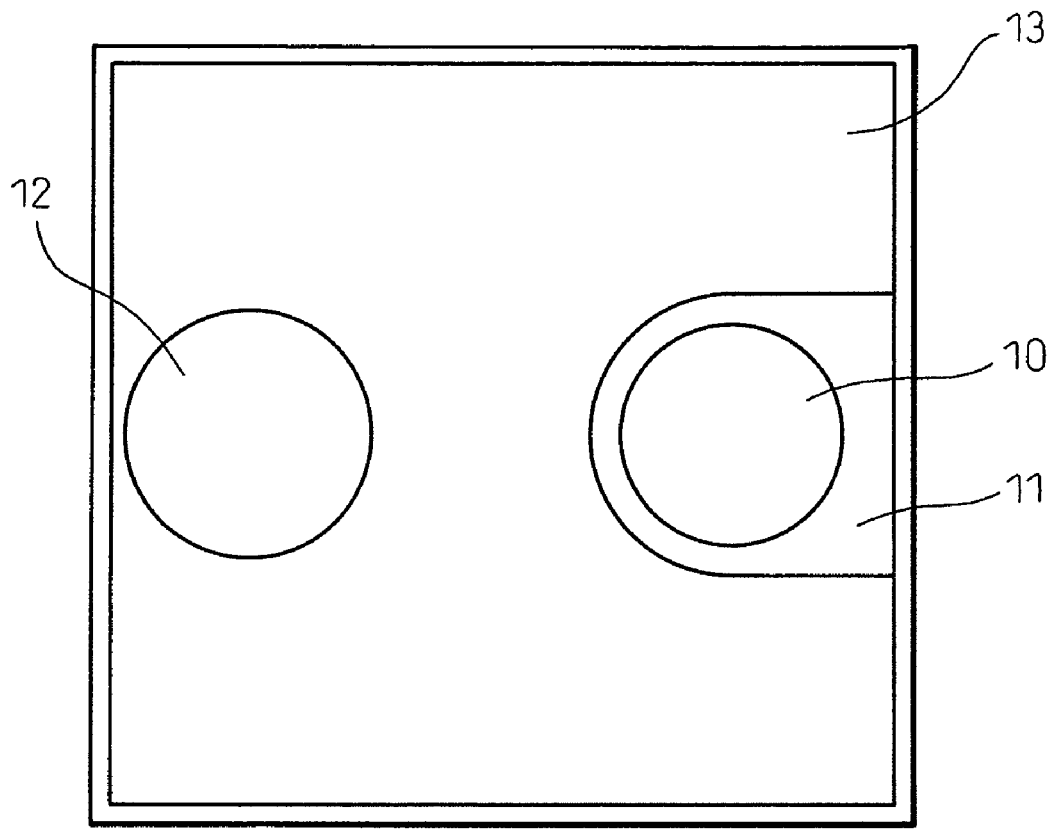
FIG. 2 is a plan view showing the electrode structure of the semiconductor light-emitting device produced in Example 2 of the present invention.

Using this epitaxial wafer comprising a sapphire substrate having stacked thereon epitaxial layers, a light-emitting diode, which is a kind of semiconductor light-emitting device, was produced. FIG. 2 is a plan view of the electrode structure of the light-emitting diode produced in this Example. In the Figure, 10 is an n-side electrode, 11 is an exposed surface of the Si-doped GaN layer 6 for forming the n-side electrode, 12 is a p-electrode bonding pad, and 13 is a light-transparent p-electrode.

With respect to the produced wafer, by using a known photolithography technique, a light-transparent p-electrode 13 composed of ITO was formed on the surface of the Mg-doped $Al_{0.02}Ga_{0.98}N$ layer, and a p-electrode bonding pad 12 having such a structure that Cr, Ti and Au were stacked in this order from the surface side of the p-electrode 13, was further formed thereon, thereby completing the p-side electrode. The wafer was then subjected to dry etching to expose a portion 11 of the Si-doped GaN layer for the formation of an n-side electrode, and an n-side electrode 10 composed of three layers of Cr, Ti and Au in this order from the semiconductor side, was produced in the exposed portion. By these operations, an electrode having a shape shown in FIG. 2 was produced on the wafer.

The wafer after the formation of p-side and n-side electrodes was subjected to grinding and polishing of the back surface of the sapphire substrate to give a mirror-like surface. This wafer was cut into a 350 μm-square chip, and the chip was placed on a lead frame with the electrodes up and connected to the lead frame through a gold wire to produce a light-emitting diode. A forward current was passed between p-side and n-side electrodes of the thus-produced light-emitting diode, as a result, the forward voltage at a current of 20 mA was 3.0 V. When light emitted through the p-side light-transparent electrode was observed, the emission wavelength was 470 nm and the emission output was 15 mW at a current of 20 mA. These properties of the light-emitting diode were obtained without fluctuation for light-emitting diodes produced from almost the entire surface of the wafer obtained above.

Comparative Example 1

In this Comparative Example, an AlN layer was formed as a first layer on an a-plane sapphire substrate by using a DC sputtering method, and a GaN layer was formed thereon as a second layer by using an MOCVD method. The substrate temperature during sputtering was set to 500° C. The film thickness and the like were the same as in Example 1.

As a result, the surface of the wafer taken out from the reaction apparatus after growing the GaN layer by an MOCVD method was white turbid and a large number of pits were observed on the surface.

FIG. 7 shows the results when the first layer according to this process was observed in the same manner as in Example 1. FIG. 8 is a view schematically showing FIG. 7. As seen from these Figures, in the first layer composed of AlN and film-formed by DC sputtering, the density of columnar crystals with a distinct crystal interface was about $5 \times 10^2$ crystals/$\mu m^2$, and the layer was found to not contain a columnar crystal with a distinct crystal interface at the density specified in the present invention.

The same sample was measured for the double crystal X-ray rocking curve of the first layer and found to show a half-width of 0.7° in the measurement of (0002) plane.

Example 3

In this Example, a layer comprising AlN and containing a columnar crystal with a distinct crystal interface was formed as a first layer on a sapphire c-plane substrate by using an RF sputtering method having a mechanism to move the magnet circularly within the target, a GaN layer was formed thereon as a second layer by using an MOCVD method, and the same epitaxial layers for LED as in Example 2 were film-formed thereon. The substrate temperature during sputtering was set to 700° C. Other conditions were the same as in Example 2.

As a result, the surface of the wafer taken out from the reaction apparatus after growing epitaxial layers for LED by an MOCVD method appeared to be a mirror surface.

The first layer was observed in the same manner as in Example 1, and this first layer composed of AlN and film-formed by RF sputtering was found to contain columnar crystals at a density of about $5 \times 10^3$ crystals/$\mu m^2$, with each crystal having a width of approximately from 5 to 10 nm.

The thus-produced wafer was processed into a light-emitting diode chip in the same manner as in Example 2, and a forward current was passed between electrodes, as a result, the forward voltage at a current of 20 mA was 3.1 V. Also, when light emitted through the p-side light-transparent electrode was observed, the emission wavelength was 460 nm and the emission output was 13 mW at 20 mA. These properties of the light-emitting diode were obtained without fluctuation for light-emitting diodes produced from almost the entire surface of the wafer obtained above.

Example 4

In this Example, a layer comprising AlGaN and containing a columnar crystal with a distinct crystal interface was formed as a first layer on an Si (111) substrate by using an RF sputtering method of rotary cathode type, an Si-doped AlGaN layer was formed thereon as a second layer by using an MOCVD method, and the same epitaxial layers for LED as in Example 2 were film-formed thereon. The Al composition in the first layer was 70%, and the Al composition in the second layer was 15%. The substrate temperature during sputtering was set to 500° C. Other conditions were the same as in Example 2.

As a result, the surface of the wafer taken out from the reaction apparatus after growing epitaxial layers for LED by an MOCVD method appeared to be a mirror surface.

The first layer was observed in the same manner as in Example 1, and this AlGaN layer film-formed by RF sputtering was found to contain columnar crystals at a density of about $2 \times 10^3$ crystals/$\mu m^2$, with each crystal having a width of about 20 nm.

The thus-produced wafer was processed into a light-emitting diode chip in the same manner as in Example 2. This time, the electrodes were provided above and below, that is, on the stacked structure side and on the substrate side. A forward current was passed between electrodes, as a result, the forward voltage at a current of 20 mA was 2.9 V. When light emitted through the p-side light-transparent electrode was observed, the emission wavelength was 460 nm and the emission output was 10 mW at 20 mA. These properties of the light-emitting diode were obtained without fluctuation for light-emitting diodes produced from almost the entire surface of the wafer obtained above.

Example 5

In this Example, a layer comprising GaN and containing a columnar crystal with a distinct crystal interface was formed as a first layer on a ZnO (0001) substrate by using a PLD method of exciting the target with a $CO_2$ laser, a Ge-doped AlGaN layer was formed thereon as a second layer by using an MOCVD method, and the same epitaxial layers for LED as in Example 2 were film-formed thereon. The Al composition in the second layer was 10%. The substrate temperature during growth of the first layer was set to 750° C. Furthermore, since production of green LED in the vicinity of 525 nm was attempted this time, the flow rate of the In raw material at the growth of the light-emitting layer was increased.

As a result, the surface of the wafer taken out from the reaction apparatus after growing epitaxial layers for LED by an MOCVD method appeared to be a mirror surface.

The first layer was observed in the same manner as in Example 1, and this GaN layer film-formed by a PLD method was found to contain columnar crystals at a density of about $5\times10^3$ crystals/$\mu m^2$, with each crystal having a width of about 5 nm.

The thus-produced wafer was processed into a light-emitting diode chip in the same manner as in Example 2. Similarly to Example 4, the electrodes were provided above and below, that is, on the stacked structure side and on the substrate side. A forward current was passed between electrodes, as a result, the forward voltage at a current of 20 mA was 3.3 V. When light emitted through the p-side light-transparent electrode was observed, the emission wavelength was 525 nm and the emission output was 10 mW at a current of 20 mA. These properties of the light-emitting diode were obtained without fluctuation for light-emitting diodes produced from almost the entire surface of the wafer obtained above.

Example 6

In this Example, a production method of a group III nitride compound semiconductor light-emitting device using the group III nitride compound semiconductor stacked structure of the present invention is described. In this Example, an epitaxial wafer having an epitaxial layer structure for a semiconductor light-emitting device, shown in FIG. 1, was finally produced, for example, by growing an n-type contact layer using Ge as the dopant on an undoped GaN crystal (second layer) produced over 6 $\mu m$ under the same conditions as in Example 1. More specifically, the epitaxial wafer has a structure where on a 50 $\mu m$-thick AlN layer 8 (first layer) containing a columnar crystal structure and being formed on a sapphire substrate 9 having a c-plane by the same growth method as described in Example 1, a 6 $\mu m$-thick undoped GaN layer 7 (second layer), a 2 $\mu m$-thick Ge-doped GaN layer 6 having an electron concentration of $1\times10^{19}$ cm$^{-3}$, a 200 Å-thick $In_{0.1}Ga_{0.9}N$ cladding layer 5 having an electron concentration of $1\times10^{18}$ cm$^{-3}$, a multiple quantum well structure 20 starting with a GaN barrier layer and ending with a GaN barrier layer, that is composed of six GaN barrier layers 3 having a layer thickness of 160 Å and five non-doped $In_{0.2}Ga_{0.8}N$ well layers 4 having a layer thickness of 30 Å, a 50 Å-thick Mg-doped $Al_{0.1}Ga_{0.9}N$ cladding layer 2, and a 0.2 $\mu m$-thick Mg-doped $Al_{0.02}Ga_{0.98}N$ layer 1 are stacked in this order from the substrate side.

FIG. 2 shows a plan view of the electrode structure of the semiconductor light-emitting device produced in this Example. In the Figure, 10 is an n-side electrode, 11 is an exposed surface of the Ge-doped GaN layer 6 for forming the n-side electrode, 12 is a p-electrode bonding pad, and 13 is a light-transparent p-electrode.

The wafer having epitaxial layers of the semiconductor light-emitting device structure above was produced through the following procedure by using an MOCVD method. The procedure up to the formation of AlN layer (first layer) 8 having a columnar crystal structure on the sapphire substrate was the same as in Example 1.

The subsequent stacking of the stacked structure was also performed in the same manner as the growth of the second layer in Example 1 by using the same MOCVD apparatus as used in Example 1.

Through such a procedure, an epitaxial wafer having an epitaxial layer structure for a semiconductor light-emitting device was produced. Here, the Mg-doped $Al_{0.02}Ga_{0.98}N$ layer exhibited p-type characteristics even without performing an annealing treatment for activating a p-type carrier.

Using this epitaxial wafer comprising a sapphire substrate having stacked thereon an epitaxial layer structure, a light-emitting diode, which is a kind of semiconductor light-emitting device, was produced. With respect to the produced wafer, by using a known photolithography technique, a transparent p-electrode 13 composed of ITO was formed on the surface of the Mg-doped $Al_{0.02}Ga_{0.98}N$ layer, and a p-electrode bonding pad 12 having such a structure that titanium, aluminum and gold were stacked in this order from the surface side was further formed thereon, thereby completing the p-side electrode. The wafer was then subjected to dry etching to expose a portion 11 of the Ge-doped GaN layer for the formation of an n-side electrode, and an n-side electrode 10 composed of four layers of Ni, Al, Ti and Au was produced in the exposed portion. By these operations, an electrode having a shape shown in FIG. 2 was produced on the wafer.

The wafer after the formation of p-side and n-side electrodes was subjected to grinding and polishing of the back surface of the sapphire substrate to give a mirror-like surface. This wafer was cut into a 350 $\mu m$-square chip, and the chip was placed on a lead frame with the electrodes up and connected to the lead frame through a gold wire to produce a light-emitting diode. A forward current was passed between p-side and n-side electrodes of the thus-produced light-emitting diode, as a result, the forward voltage at a current of 20 mA was 3.0 V. When light emitted through the p-side light-transparent electrode was observed, the emission wavelength was 470 nm and the emission output was 15 mW. These properties of the light-emitting diode were obtained without fluctuation for light-emitting diodes produced from almost the entire surface of the wafer obtained above.

Example 7

In this Example, an AlGaN layer was formed as a first layer on a c-plane sapphire substrate by using an RF sputtering method, and an AlGaN layer was formed thereon as a second layer by using an MOCVD method. The substrate temperature during sputtering was set to 300° C., and other conditions were the same as in Example 1. The Al compositions of the first layer and second layer were the same and contained 20% of Al.

As a result, the surface of the wafer taken out from the reaction apparatus after growing epitaxial the AlGaN layer by an MOCVD method appeared to be a mirror surface, but when observed through an optical microscope, the surface contained fine irregularities.

This wafer was observed using a cross-sectional TEM method. The AlGaN layer film-formed by RF sputtering contained a columnar crystal but AlGaN was not formed in some isolated portions, and the layer was not a continuous film and covered only about 60% of the substrate.

The thus-produced wafer was processed into a light-emitting diode chip in the same manner as in Example 6. A forward current was passed between electrodes, as a result, the forward voltage at a current of 20 mA was 2.9 V. This value is too low and reveals that the current is leaking. When light emitted through the p-side light-transparent electrode was observed, the emission wavelength was 460 nm and the emission output was only 7 mW.

Example 8

In this Example, an aggregate of GaN columnar crystals was formed as a first layer on a ZnO (0001) substrate by using a PLD method of exciting the target with a $CO_2$ laser, a Ge-doped AlGaN layer was formed thereon as a second layer by using an MOCVD method, and the same LED structure as in Example 6 was film-formed thereon. The Al composition in the second layer was 10%. The substrate temperature during sputtering was set to 750° C. Furthermore, since production of green LED in the vicinity of 525 nm was attempted this time, the flow rate of the In raw material for the light-emitting layer was increased.

As a result, the surface of the wafer taken out from the reaction apparatus after growing the LED stacked structure by an MOCVD method appeared to be a mirror surface.

This wafer was observed using a cross-sectional TEM method. The GaN layer film-formed by a PLD method was composed of columnar crystals, with each crystal having a width of about 5 nm. The first layer covered the entire surface of the substrate.

The thus-produced wafer was processed into a light-emitting diode chip, and electrodes were provided above and below, that is, on the stacked structure side and on the substrate side, in the same manner as in Example 4. A forward current was passed between electrodes, as a result, the forward voltage at a current of 20 mA was 3.3 V. When light emitted through the p-side light-transparent electrode was observed, the emission wavelength was 525 nm and the emission output was 10 mW. These properties of the light-emitting diode were obtained without fluctuation for light-emitting diodes produced from almost the entire surface of the wafer obtained above.

INDUSTRIAL APPLICABILITY

The group III nitride compound semiconductor stacked structure of the present invention has a surface layer composed of a group III nitride compound semiconductor crystal having good crystallinity. Accordingly, when a group III nitride compound semiconductor crystal layer imparted with a function is further formed on the stacked structure, a semiconductor device having excellent properties, such as light-emitting diode, laser diode and electronic device, can be fabricated.

The invention claimed is:

1. A group III nitride compound semiconductor stacked structure comprising a substrate having provided thereon a first layer comprising a group III nitride compound semiconductor and a second layer being in contact with the first layer and comprising a group III nitride compound semiconductor, wherein the first layer contains a columnar crystal with a definite crystal interface, which is a crystal grain having a distinct crystal interface and showing a hexagon-based cross-sectional shape in plan view, and the columnar crystal density is from $1 \times 10^3$ to $1 \times 10^5$ crystals/µm².

2. The group III nitride compound semiconductor stacked structure according to claim 1, wherein the first layer covers at least 90% of the substrate surface.

3. The group III nitride compound semiconductor stacked structure according to claim 1, wherein the width of the columnar crystal with a definite crystal interface is from 1 to 50 nm.

4. The group III nitride compound semiconductor stacked structure according to claim 3, wherein the width of the columnar crystal with a definite crystal interface is from 2 to 30 nm.

5. The group III nitride compound semiconductor stacked structure according to claim 1, wherein the thickness of the first layer is from 10 to 500 nm.

6. The group III nitride compound semiconductor stacked structure according to claim 5, wherein the thickness of the first layer is from 20 to 100 nm.

7. The group III nitride compound semiconductor stacked structure according to claim 1, wherein the first layer is an Al-containing group III nitride compound semiconductor.

8. The group III nitride compound semiconductor stacked structure according to claim 7, wherein the first layer comprises AlN.

9. The group III nitride compound semiconductor stacked structure according to claim 1, wherein the second layer is AlGaN.

10. The group III nitride compound semiconductor stacked structure according to claim 1, wherein the second layer is GaN.

11. The group III nitride compound semiconductor stacked structure according to claim 1, wherein the group III nitride compound semiconductor forming the first layer and the group III nitride compound semiconductor forming the second layer are different materials.

12. The group III nitride compound semiconductor stacked structure according to claim 11, wherein the first layer is AlN and the second layer is GaN.

13. The group III nitride compound semiconductor stacked structure according to claim 1, wherein the substrate is composed of a material selected from the group consisting of sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten and molybdenum.

14. A group III nitride compound semiconductor light-emitting device comprising the group III nitride compound semiconductor stacked structure according to claim 1.

15. A lamp comprising the group III nitride compound semiconductor light-emitting device according to claim 14.

16. A method for producing a group III nitride compound semiconductor stacked structure, said stacked structure comprising a substrate having provided thereon a first layer comprising a group III nitride compound semiconductor and a second layer being in contact with the first layer and comprising a group III nitride compound semiconductor, wherein the first layer contains a columnar crystal with a definite crystal interface, which is a crystal grain having a distant crystal interface and showing a hexagon-based cross-sectional shape in plan view, and the columnar crystal density is from $1 \times 10^3$ to $1 \times 10^5$ crystals/µm², said method comprising growing, on a substrate, a first layer comprising a columnar crystal of group III nitride compound semiconductor by activating a group III metal raw material and a nitrogen element-containing gas with a plasma to cause a reaction therebetween, and then growing a second layer being in contact with the first layer and comprising a group III nitride compound semiconductor.

17. The method for producing a group III nitride compound semiconductor stacked structure according to claim 16, wherein the growth method of the second layer is MOCVD.

18. The method for producing a group III nitride compound semiconductor stacked structure according to claim 16, wherein the growth method of the second layer is reactive sputtering.

19. The method for producing a group III nitride compound semiconductor stacked structure according to claim 16, wherein the substrate temperature at the growth of the second layer is 900° C. or more.

20. The method for producing a group III nitride compound semiconductor stacked structure according to claim 16, wherein the growth method of the first layer is at least one member selected from the group consisting of sputtering, PLD, PED and CVD.

21. The method for producing a group III nitride compound semiconductor stacked structure according to claim 20, wherein the growth method of the first layer is sputtering.

22. The method for producing a group III nitride compound semiconductor stacked structure according to claim 21, wherein the growth method of the first layer is reactive sputtering performed while flowing a nitrogen source in the reactor.

23. The method for producing a group III nitride compound semiconductor stacked structure according to claim 22, wherein the growth method of the first layer is sputtering utilizing ammonia as the nitrogen source.

24. The method for producing a group III nitride compound semiconductor stacked structure according to claim 22, wherein the growth method of the first layer is sputtering utilizing a nitrogen gas as the nitrogen source.

25. The method for producing a group III nitride compound semiconductor stacked structure according to claim 21, wherein the growth method of the first layer is RF sputtering.

26. The method for producing a group III nitride compound semiconductor stacked structure according to claim 25, wherein the growth method of the first layer is RF sputtering performed while moving the position of the magnet in the cathode.

27. The method for producing a group III nitride compound semiconductor stacked structure according to claim 21, wherein the substrate temperature at the growth of the first layer is from 400 to 800° C.

* * * * *